United States Patent
Jang et al.

(10) Patent No.: US 9,030,876 B2
(45) Date of Patent: May 12, 2015

(54) MEMORY SYSTEM, PROGRAM METHOD THEREOF, AND COMPUTING SYSTEM INCLUDING THE SAME

(71) Applicant: Samsung Electronics Co., Ltd., Suwon-si (KR)

(72) Inventors: Jun-Ho Jang, Suwon-si (KR); In-Hwan Choi, Seoul (KR); Woon-Jae Chung, Gunpo-si (KR); Song-Ho Yoon, Yongin-si (KR); Kyung-Wook Ye, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/139,175

(22) Filed: Dec. 23, 2013

(65) Prior Publication Data

US 2014/0112070 A1  Apr. 24, 2014

Related U.S. Application Data

(60) Continuation of application No. 13/550,000, filed on Jul. 16, 2012, now Pat. No. 8,614,914, which is a division of application No. 13/220,194, filed on Aug. 29, 2011, now Pat. No. 8,223,544, which is a division of application No. 12/150,558, filed on Apr. 28, 2008, now Pat. No. 8,031,522.

(30) Foreign Application Priority Data

Apr. 30, 2007 (KR) .......................... 10-2007-0042041

(51) Int. Cl.
  *G11C 11/34*   (2006.01)
  *G11C 16/10*   (2006.01)
  *G11C 11/56*   (2006.01)

(52) U.S. Cl.
  CPC ............ *G11C 16/10* (2013.01); *G11C 11/5628* (2013.01)

(58) Field of Classification Search
  CPC . G11C 16/10; G11C 11/5628; G11C 16/0483
  USPC ........................................ 365/185.03, 185.12
  See application file for complete search history.

(56) References Cited

U.S. PATENT DOCUMENTS 5,923,587 A    7/1999  Choi
6,075,734 A    6/2000  Jang
(Continued)

FOREIGN PATENT DOCUMENTS

JP    2002-334586    11/2002
JP    2007-048410    2/2007
(Continued)

OTHER PUBLICATIONS

"Memory System, Program Method Thereof, and Computing System Including the Same" Specification, Drawings and Prosecution History, of U.S. Appl. No. 13/220,194, filed Aug. 29, 2011, by Inventor(s) Jun-Ho Jang, et al.
(Continued)

*Primary Examiner* — Anthan Tran
(74) *Attorney, Agent, or Firm* — Onello & Mello, LLP.

(57) ABSTRACT

Disclosed is a memory system and a method of programming a multi-bit flash memory device which includes memory cells configured to store multi-bit data, where the method includes and the system is configured for determining whether data to be stored in a selected memory cell is an LSB data; and if data to be stored in a selected memory cell is not an LSB data, backing up lower data stored in the selected memory cell to a backup memory block of the multi-bit flash memory device.

6 Claims, 15 Drawing Sheets

(56) References Cited

U.S. PATENT DOCUMENTS

| | | |
|---|---|---|
| 6,122,188 A | 9/2000 | Kim et al. |
| 6,549,457 B1 | 4/2003 | Srinivasan et al. |
| 6,988,175 B2 | 1/2006 | Lasser |
| 7,275,140 B2 | 9/2007 | Paley |
| 7,761,652 B2 | 7/2010 | Kim et al. |
| 8,031,522 B2 | 10/2011 | Jang et al. |
| 8,112,574 B2 * | 2/2012 | Lee et al. ............ 711/103 |
| 8,223,544 B2 | 7/2012 | Jang et al. |
| 8,614,914 B2 | 12/2013 | Jang et al. |
| 2005/0144368 A1 * | 6/2005 | Chung et al. ............ 711/103 |
| 2006/0239692 A1 | 10/2006 | Lee et al. |
| 2007/0014163 A1 | 1/2007 | Kim |
| 2007/0035997 A1 | 2/2007 | Shibata et al. |
| 2007/0086239 A1 | 4/2007 | Litsyn et al. |
| 2007/0204128 A1 | 8/2007 | Lee et al. |
| 2008/0074928 A1 | 3/2008 | Choi |
| 2008/0094893 A1 | 4/2008 | Choi |
| 2008/0162789 A1 | 7/2008 | Choi et al. |
| 2008/0266948 A1 | 10/2008 | Jang et al. |
| 2011/0314207 A1 | 12/2011 | Jang et al. |
| 2012/0284452 A1 | 11/2012 | Jang et al. |

FOREIGN PATENT DOCUMENTS

| | | |
|---|---|---|
| KR | 100634333 | 10/2006 |
| KR | 1020070019575 | 2/2007 |
| KR | 1020080027419 | 3/2008 |
| KR | 1020080035353 | 4/2008 |

OTHER PUBLICATIONS

"Memory System, Program Method Thereof, and Computing System Including the Same" Specification, Drawings and Prosecution History, of U.S. Appl. No. 12/150,558, filed Apr. 28, 2008, by Inventor(s) Jun-Ho Jang, et al.

"Memory System, Program Method Thereof, and Computing System Including the Same" Specification, Drawings and Prosecution History, of U.S. Appl. No. 13/550,000, filed Jul. 16, 2012, by Inventor(s) Jun-Ho Jang, et al.

* cited by examiner

MEMORY SYSTEM, PROGRAM METHOD THEREOF, AND COMPUTING SYSTEM INCLUDING THE SAME

CROSS-REFERENCE TO RELATED APPLICATIONS

This application is a continuation application of U.S. patent application Ser. No. 13/550,000, filed on Jul. 16, 2012, now U.S. Pat. No. 8,614,914, issued on Dec. 24, 2013, which is a divisional application of U.S. patent application Ser. No. 13/220,194, filed on Aug. 29, 2011, now U.S. Pat. No. 8,223,544, issued on Jul. 17, 2012, which is a divisional application of U.S. patent application Ser. No. 12/150,558, filed on Apr. 28, 2008, now U.S. Pat. No. 8,031,522, issued on Oct. 4, 2011, which claims priority under 35 U.S.C. §119 of Korean Patent Application No. 10-2007-0042041 filed on Apr. 30, 2007, the contents of which applications are incorporated herein in their entirety by reference.

BACKGROUND

The present invention disclosed herein relates to a semiconductor memory device and more particularly, to a memory system including a flash memory device.

In recent years, applications of storage devices, such as volatile memories and nonvolatile memories, are rapidly spreading into mobile apparatuses such as MP3 players, PMPs, mobile phones, notebook computers, PDAs, and the like. Such mobile apparatuses increasingly necessitate large volume storage capacity in order to provide various functions, such as moving picture reproducing functions. Various efforts have been made to satisfy such needs. As one of the efforts, a multi-bit memory device has been proposed which stores 2 or more data bits in one memory cell. Exemplary multi-bit memory devices for storing multi-bit data in one memory cell are disclosed in U.S. Pat. No. 6,122,188 entitled "NON-VOLATILE MEMORY DEVICE HAVING MULTI-BIT CELL STRUCTURE AND A METHOD OF PROGRAMMING SAME", U.S. Pat. No. 6,075,734 entitled "INTEGRATED CIRCUIT MEMORY DEVICE FOR STORING A MULTI-BIT DATA AND A METHOD FOR READING STORED IN THE SAME", and U.S. Pat. No. 5,923,587 entitled "MULTI-BIT MEMORY CELL ARRAY OF A NON-VOLATILE SEMICONDUCTOR MEMORY DEVICE AND METHOD FOR DRIVING THE SAME", the entire contents of which are hereby incorporated by reference.

In a case where a memory cell stores 1-bit data, it has a threshold voltage in either one of two threshold voltage distributions. That is, a memory cell has either one of two states indicating data '1' and data '0', respectively. On the other hand, in the case that a memory cell that stores 2-bit data, it has a threshold voltage in one of four threshold voltage distributions. That is, a memory cell has one of four states indicating data '11', data '10', data '01' and data '00', respectively.

A method for programming multi-bit data in a memory cell can be implemented in various ways. For example, two data bits stored in each memory cell consists of page data (hereinafter, referred to as LSB (least significant bit) data (or, lower data) and MSB (most significant bit) data (or, upper data)), respectively. In this case, firstly, an LSB data bit is programmed in a memory cell, and then an MSB data bit is programmed in the memory cell. Hereinafter, this manner of programming a multi-data in a memory is called page unit programming, which will be more fully described below.

One memory cell can be programmed to have one of '11', '10', '00' and '01' states. For convenience, it is assumed that the '11', '10', '00' and '01' states correspond to ST0, ST1, ST2 and ST3, respectively. A memory cell having a '11' state is an erased memory cell, and a threshold voltage of a memory cell having a '10' state is higher than that having a '11'state. A threshold voltage of a memory cell having a '00' state is higher than that having a '10' state, and a threshold voltage of a memory cell having a '01' state is higher than that having a '00' state. If an LSB program operation is made under the assumption, as illustrated in FIG. 1A, that a memory cell has an erased state or a '10' state (ST1). If there is performed an MSB program operation following the LSB program operation, as illustrated in FIG. 1B, a memory cell having a '11' state has an erased state or a '01' state (ST3), while a memory cell having a '10' state (ST1) has a '10' state (ST1) or a '00' state (ST2). That is, a memory cell is programmed into a '01' state when LSB data is '1', while it is programmed into a '00' state when LSB data is '0'.

One problem arises when storing multi-bit data, which will be more fully described below.

For convenience of description, there will be described an operation of storing 2-bit data in one memory cell. As described above, firstly, a lower data bit can be stored in a memory cell. And then, an upper data bit can be stored in the memory cell. In a case where a power is turned off while an upper data bit is programmed in a memory cell, a program operation of a finally programmed page at power-up is cancelled. On the other hand, assuming that a power is turned off while an upper data bit is programmed in a memory cell, a previously stored lower data bit can be lost. This is because a threshold voltage corresponding to a lower data bit is varied at a program operation of an upper data bit.

SUMMARY OF THE INVENTION

The present invention is directed to a memory system and program method capable of preventing lower data from being lost due to a program failure of upper data.

The present invention is further directed to provide a memory system and data recovery method capable of recovering lower data lost due to a power-up failure.

One aspect of the present invention is to provide a method of programming a multi-bit flash memory device which includes memory cells, each configured to store multi-bit data. The method comprises determining whether data to be stored in a selected memory cell is an LSB data; and if data to be stored in a selected memory cell is not an LSB data, backing up lower data stored in the selected memory cell to a backup memory block of the multi-bit flash memory device.

The method can further comprise, after backing up the lower data to the backup memory block, programming the data to be stored in the selected memory block.

The method can further comprise, if the data to be stored in the selected memory cell is determined to be an LSB data, programming the data to be stored in the selected memory cell without a backup operation.

The flash memory device can comprise a memory device selected from a group comprising a NAND flash memory device, a NOR flash memory device, a CTF memory device, and a phase change memory device.

Each of the memory cells can be configured to store 2-bit data.

The lower data backed up to the backup memory block can be LSB data.

Each of the memory cells can be configured to store M-bit data, where M is an integer of 3 or more.

The lower data backed up to the backup memory can include all or at least one data bit from a group comprising a first data bit to a (M-1)th data bit.

Another aspect of the present invention is to provide a method of programming a multi-bit flash memory device which includes memory cells, each configured to store multi-bit data. The method comprises programming data to be stored in a selected memory cell; determining whether the data to be stored in the selected memory cell is LSB data; and if the data to be stored in the selected memory cell is determined to be LSB data, backing up lower data stored in the selected memory cell to a backup memory block of the multi-bit flash memory device.

Each of the memory cells can be configured to store 2-bit data.

The lower data backed up to the backup memory block can be LSB data.

Each of the memory cells can be configured to store M-bit data, where M is an integer of 3 or more.

The lower data backed up to the backup memory can include all or at least one data bit from a group comprising a first data bit to a (M-1)th data bit.

Still other aspect of the present invention is to provide a method of programming a multi-bit flash memory device which includes memory cells, each configured to store multi-bit data. The method comprises determining whether data to be stored in a selected memory block is data to be backed up, based on a page offset value; and if the data to be stored in the selected memory block is determined to be data to be backed up, backing up to a backup memory block lower page data of the selected memory block that belongs to a page offset value on the basis of a start page of data to be stored in the selected memory block.

If the data to be stored in the selected memory block is determined to be data to be backed up, lower page data of the selected memory block belonging to the page offset value can be backed up to the backup memory block.

If the data to be stored in the selected memory block is not data to be backed up, the data to be stored can be programmed in the selected memory block.

The flash memory device can be a NAND flash memory device.

The multi-bit data can be M-bit data, where M is an integer of 2 or more.

In some cases, each of the memory blocks can have one page offset value.

In some cases, each of the memory blocks can have at least two different page offset values.

If a power failure is detected with respect to the selected memory block at power-on, data to be backed up to the backup memory block and valid data of the selected memory block can be copied to a free memory block Further still other aspect of the present invention is to provide a memory system which comprises a multi-bit flash memory device including a plurality of memory blocks; and a memory controller configured to control the multi-bit flash memory device. The memory controller is configured to determine whether there exists lower data belonging to a page offset value on the basis of a start address of data to be programmed in the multi-bit flash memory device. And when it is determined that there exists lower data belonging to a page offset value on the basis of a start address of data to be programmed in the multi-bit flash memory device, the memory controller is configured to control the multi-bit flash memory device to backup lower data belonging to a page offset value to a free memory block from the memory blocks.

The memory controller can be configured to control the multi-bit flash memory device so that the data to be programmed is programmed in the selected memory block when there exists no lower data belonging to a page offset value on the basis of a start address of data to be programmed.

Each of the memory cells can be configured to store 2-bit data.

The lower data to be backed up to the backup memory block can be LSB data.

Each of the memory cells can be configured to store M-bit data, where M is an integer of 3 or more.

The lower data to be backed up to the backup memory block can be a data bit selected from a group comprising a first data bit to a (M-1)th data bit.

The memory system can be configured to detect whether a power failure occurs with respect to the selected memory block.

The memory controller can be configured to control the multi-bit flash memory device so that data backed up to the backup memory block and valid data of the selected memory block are copied to a free memory block when a power failure to the selected memory block is detected.

The multi-bit flash memory device can be a NAND flash memory device.

The multi-bit flash memory device and the memory controller can constitute an OneNAND™ flash memory device.

Still other aspect of the present invention is to provide a memory system which comprises a multi-bit flash memory device including a plurality of memory blocks; and a memory controller configured to control the multi-bit flash memory device. The memory controller is configured to determine, as a start address of data to be programmed, an address obtained by adding an address of the data to be programmed and a page offset value.

Still other aspect of the present invention is to provide a memory system which comprises a multi-bit flash memory device including a plurality of memory blocks; and a memory controller configured to control the multi-bit flash memory device. The memory controller is configured to assign at least one page to a free page, wherein data to be programmed in the at least one page is data affecting lower data.

Still other aspect of the present invention is to provide a memory system which comprises a multi-bit flash memory device including a plurality of memory blocks; and a memory controller configured to control the multi-bit flash memory device. The memory controller is configured to determine whether data to be stored in the multi-bit flash memory device is meta data; and wherein when data to be stored in the multi-bit flash memory device is determined to be meta data, the memory controller is configured to determine an address obtained by adding an address of the meta data and a page offset value, as a start address of the meta data.

The memory controller can be configured to determine whether there exists lower data belonging to a page offset value on the basis of a start address of data to be programmed in the multi-bit flash memory device when data to be stored in the multi-bit flash memory device is determined not to be meta data.

The memory controller can be configured to control the multi-bit flash memory device so that lower data belonging to a page offset value on the basis of a start address of data to be programmed is backed up to a free memory block of the memory blocks when there exists lower data belonging to a page offset value on the basis of a start address of data to be programmed in the multi-bit flash memory device.

The memory controller can be configured to control the multi-bit flash memory device so that data to be programmed is programmed in the selected memory block when there exists no lower data belonging to a page offset value on the basis of a start address of data to be programmed.

Further still other aspect of the present invention is to provide a memory system which comprises a multi-bit flash memory device including a plurality of memory blocks; and a memory controller configured to control the multi-bit flash memory device. The memory controller is configured to determine whether data to be stored in the multi-bit flash memory device is meta data; and when data to be stored in the multi-bit flash memory device is determined to be meta data, the memory controller is configured to assign at least one page to a free page, wherein data to be programmed in the at least one page is data affecting lower data.

The memory controller can be configured to determine whether there exists lower data belonging to a page offset value on the basis of a start address of data to be programmed in the multi-bit flash memory device when data to be stored in the multi-bit flash memory device is determined not to be meta data.

The memory controller can be configured to control the multi-bit flash memory device to backup lower data belonging to a page offset value on the basis of a start address of data to be programmed to a free memory block from the memory blocks when there exists lower data belonging to a page offset value on the basis of a start address of data to be programmed.

The memory controller can be configured to control the multi-bit flash memory device to program the data to be programmed to a selected memory block when there exists no lower data belonging to a page offset value on the basis of a start address of data to be programmed.

BRIEF DESCRIPTION OF THE FIGURES

Non-limiting and non-exhaustive embodiments in accordance with the present invention will be described with reference to the following figures, wherein like reference numerals refer to like parts throughout the various figures unless otherwise specified. In the figures.

DETAILED DESCRIPTION OF PREFERRED EMBODIMENTS

Figure 1A:
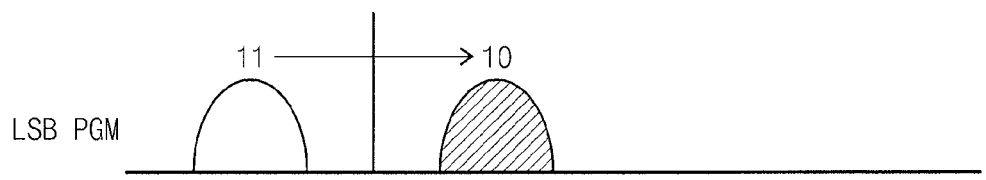
FIGS. 1A and 1B are diagrams for describing a program method according to a conventional page unit program operation.
Figure 1B:
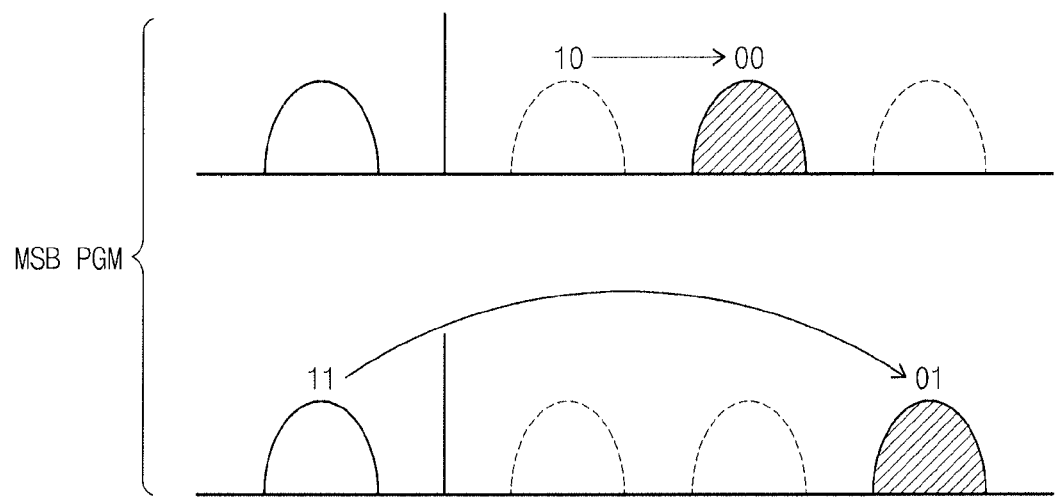
Figure 1B:
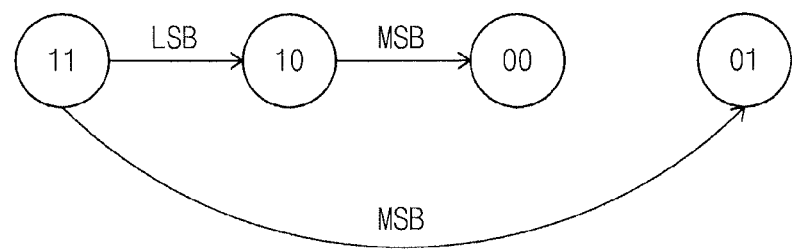

Preferred embodiments of systems and methods in accordance with aspects of the present invention will be described below in more detail with reference to the accompanying drawings, showing a flash memory device as an example for illustrating structural and operational features in accordance with the invention. The present invention can, however, be embodied in different forms and should not be construed as limited to the embodiments set forth herein. Like reference numerals refer to like elements throughout the accompanying figures.

Figure 2:
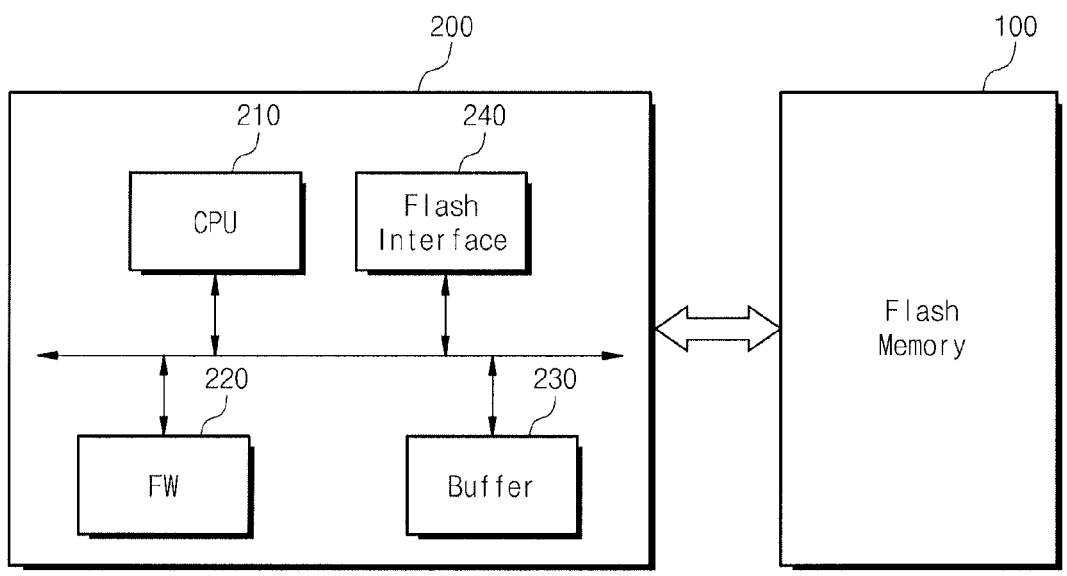
FIG. 2 is a block diagram showing an embodiment of a memory system according to aspects of the present invention.

FIG. 2 is a block diagram showing an embodiment of a memory system according to aspects of the present invention.

Referring to FIG. 2, a memory system includes a flash memory device 100 and a memory controller 200. The flash memory device 100 and the memory controller 200 may constitute a memory card, for example. In this case, the memory controller 200 may be configured to interface with an external device in various interface manners. Alternatively, the flash memory device 100 and the memory controller 200 may constitute a OneNAND™ flash memory device that is formed of a single chip. But, one skilled in the art will appreciate that a memory system according to the present invention is not limited to particular embodiments provided in this disclosure.

The flash memory device 100 may be a multi-bit flash memory device that stores multi-bit data. The flash memory device 100 may be configured to perform program, erase, and read operations under the control of the memory controller 200. The flash memory device 100 may be, for example, a nonvolatile memory device such as a NAND flash memory device, a CTF memory device, a NOR flash memory device, a phase change memory device, and the like. The memory controller 200 can be configured to control the flash memory device in response to a command from an external device (e.g., a host). The memory controller 200 can comprise a central processing unit (CPU) 210, a memory 220 for storing a set of instructions embodied in firmware, a buffer memory 230, and a flash interface 240. Although not shown in figures, in a case where a memory system in FIG. 2 constitutes a memory card, the memory controller 200 can further comprise functional blocks, such as a security block, an encipher/decipher block, and the like, needed to perform functions of the memory card.

When a command is received from an external device, the CPU 210 can control operation procedures corresponding to the input command based on the firmware stored in the memory 220. The firmware stored in the memory 220 can include a flash translation layer (FTL), such as one well known in the art. The FTL can include an address mapping function, a bad block managing function, a power failure recovery function, a data backup function according to the present invention for preventing losing of lower data, and the like. The memory 220 can be a volatile memory or a nonvolatile memory. The firmware stored in the memory 220 can be stored in the flash memory device 100. In this case, the firmware can be loaded onto the memory 220 from the flash memory device 100 at power-up. The buffer memory 230 can be used to buffer data to be stored in the flash memory device 100 or data read out from the flash memory device 100. The flash interface 240 can transfer an address and/or data with a read/program/erase command to the flash memory device 100 based on the control of the CPU 210.

When a program operation is required, in accordance with aspects of the present invention, the memory controller 200 can determine whether data to be stored in a page corresponding to the required program operation is an LSB data bit of multi-bit data. If the data to be stored is determined to be the LSB data bit, then the memory controller 200 can transfer a command, an address and data to the flash memory device 100 according to a conventional program procedure. If the data to be stored is not the LSB data bit, then the memory controller 200 can control the flash memory device 100 so that data of memory cells related to data to be stored is backed up to a free memory block of the flash memory device 100. A data backup operation can be performed prior to a program operation or after the LSB data bit is programmed, as will be more fully described hereinafter. With this data backup operation, it is possible to prevent lower data bits from being lost due to power failure caused at a program operation of upper data bits. Further, it is possible to recover lower data bits lost due to power failure caused at a program operation of upper data bits. This will be more fully described hereinafter.

Figure 3:
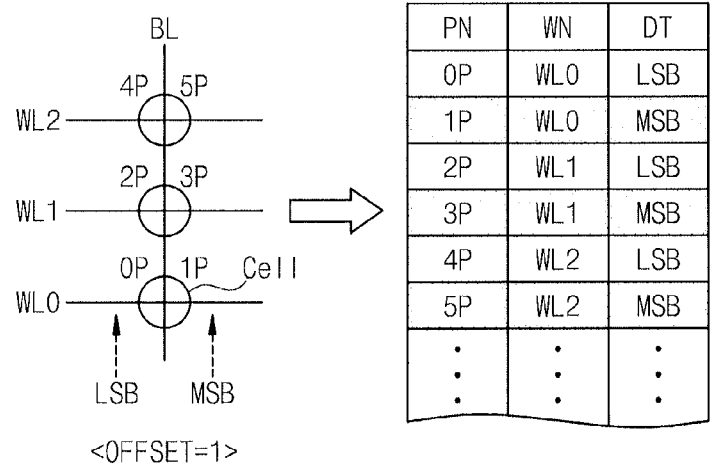
FIGS. 3 to 5 are diagrams for describing embodiments of various approaches for programming a page unit of a multi-bit flash memory device.
Figure 4:
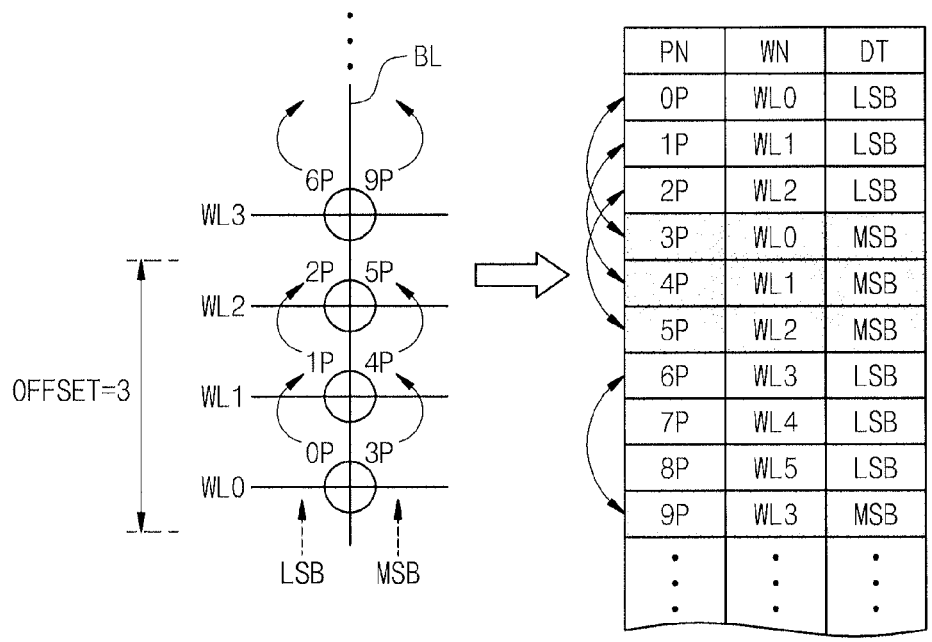
Figure 5:
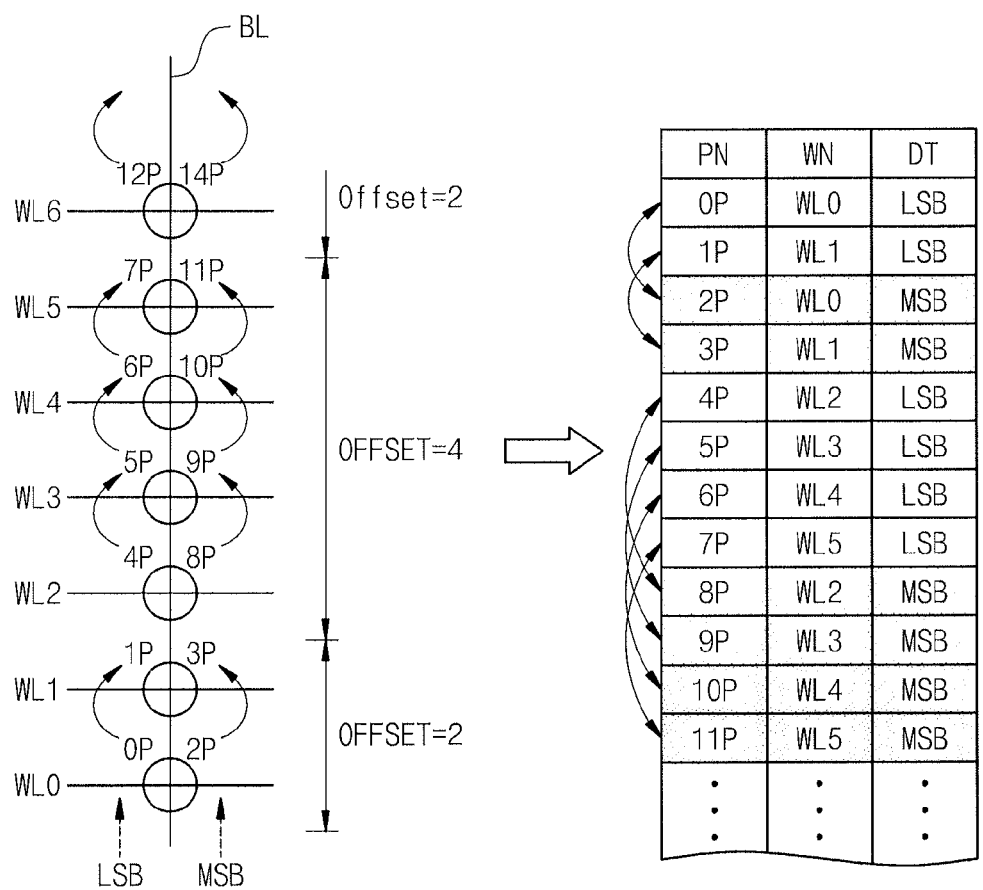

FIGS. 3 to 5 are diagrams for describing embodiments of various approaches for programming a page unit of a multi-bit flash memory device. For convenience of description, it is assumed that 2-bit data is stored in a memory cell. Hereinafter, among two data bits stored in a memory cell, one is called a lower data bit (or, an LSB data bit), and the other is called an upper data bit (or, an MSB data bit). As will be appreciated by those skilled in the art, these approaches can be extended to data having more than 2 bits.

A plurality of memory cells can be connected to each word line. In FIG. 3, there are illustrated three memory cells connected to three word lines WL0 to WL2 and one bit line BL. But, it will be apparent to one skilled in the art that a greater plurality of memory cells is connected to each word line. Data bits stored in respective memory cells connected to each word line may constitute two page data. For example, LSB/lower data bits stored in respective memory cells connected to a word line WL0 can constitute an LSB/lower page data, and MSB/upper data bits stored in respective memory cells connected to the word line WL0 can constitute MSB/upper page data.

As illustrated in FIG. 3, a first page data bit 0P (as LSB page data) and a second page data bit 1P (as MSB page data) can be successively stored in a memory cell connected to a word line WL0. In case of a word line WL1, a third page data bit 2P (as LSB page data) and a fourth page data bit 3P (as MSB page data) can be successively stored in a memory cell connected to the word line WL1. Likewise, in a word line WL2, a fifth page data bit 4P (as LSB page data) and a sixth page data bit 5P (as MSB page data) can be successively stored in a memory cell connected to a word line WL2. Making sure of the relationship between a word line number WN, a page number PN, and a data type DT indicating LSB data and MSB data, as understood from a table in FIG. 3, LSB page data and MSB page data are stored in a memory cell of the same row/word line. In other words, a distance between an LSB page and an MSB page stored in the same memory cell (hereinafter, referred to as a "page offset value") is '1'. And in a case where the page offset value is '1', LSB page data and MSB page data can be successively programmed in a memory cell.

Referring to the page unit program approach of FIG. 4, a first page data 0P, a second page data 1P and a third page data 2P can be successively programmed in memory cells that are connected to word lines WL0, WL1 and WL2, respectively. And then, a fourth page data 3P, a fifth page data 4P and a sixth page data 5P can be successively programmed in memory cells that are connected to the word lines WL0, WL1 and WL2, respectively. In this case, a distance between an LSB page and an MSB page stored in the same memory cell, that is, a page offset value is '3'. And in a case where a page offset value is '3', LSB page data and MSB page data may not successively be programmed in a memory cell.

With reference to the page unit program approach of FIG. 5, a page offset value is not constantly maintained, but rather is divided into different values. For example, as illustrated in FIG. 5, a page offset values include '2' and '4'. As understood from FIG. 5, a first page data 0P and a second page data 1P can be programmed in memory cells that are connected to word lines WL0 and WL1, respectively. And then, a third page data 2P and a fourth page data 3P can be programmed in memory cells that are connected to the word lines WL0 and WL1, respectively. In this case, a page offset value between an LSB page and an MSB page are stored in the same cell, that is, a page offset value is '2'. On the other hand, a fifth page data 4P to an eighth page data 7P can be successively programmed in memory cells that are connected to word lines WL2 to WL5, respectively. And then, a ninth page data 8P to a twelfth page data 11P can be successively programmed in memory cells that are connected to the word lines WL2 to WL5, respectively. In this case, a distance between an LSB page and an MSB page stored in the same memory cell, that is, a page offset value, is '4'.

Figure 6:
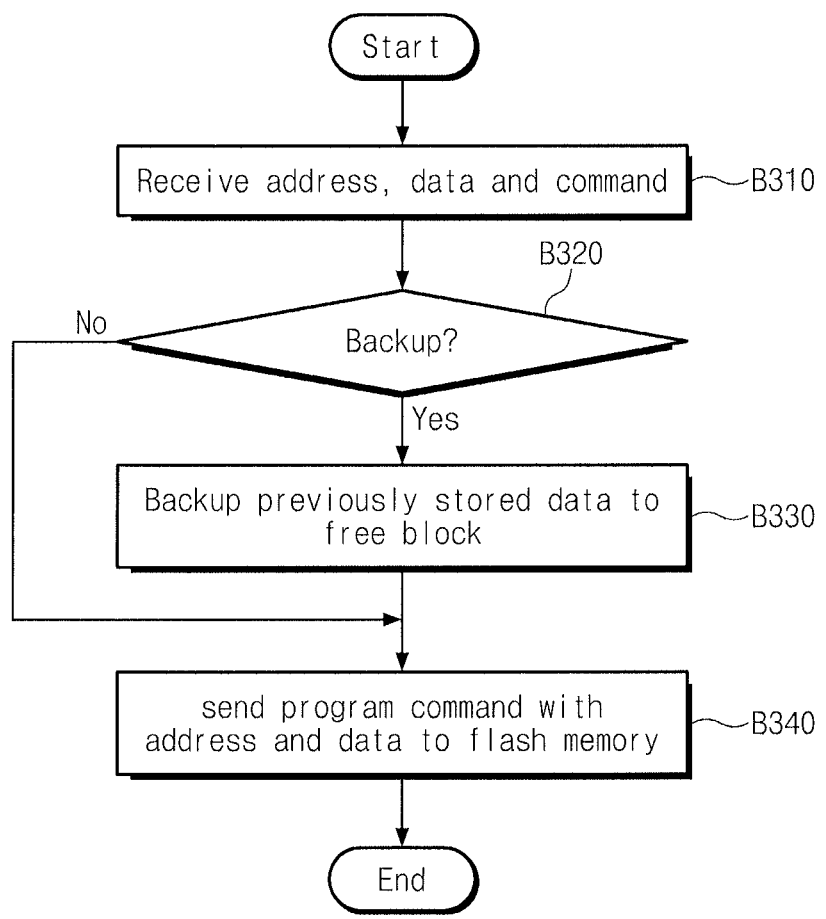
FIG. 6 is a flowchart for describing an embodiment of a program operation of a memory system according to aspects of the present invention.
Figure 7:
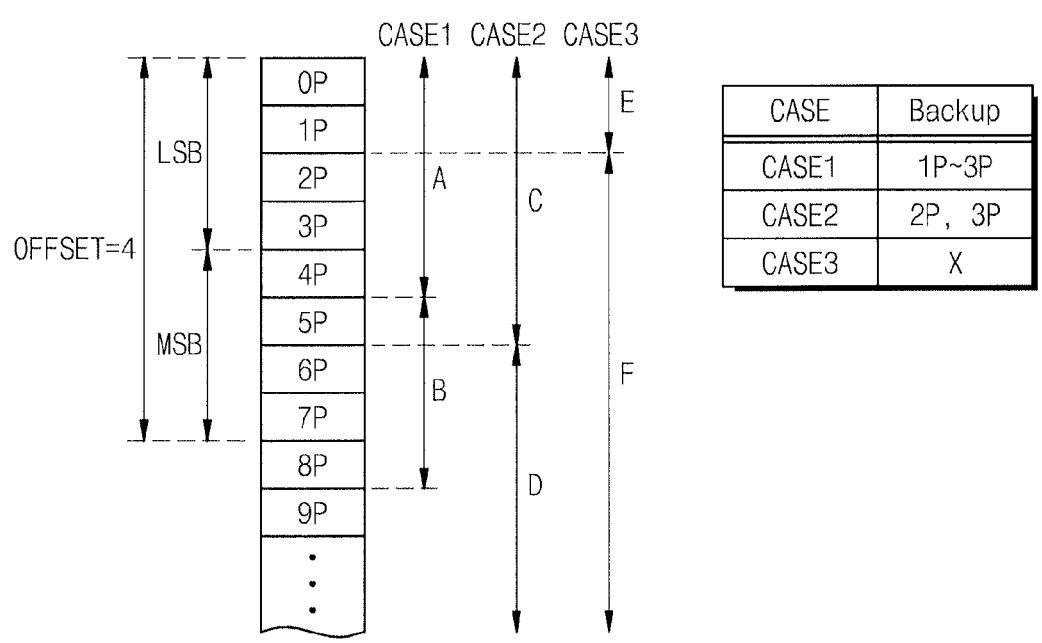
FIGS. 7 and 8 are diagrams for describing embodiments of a program operation of a memory system according to aspects of the present invention.
Figure 8:
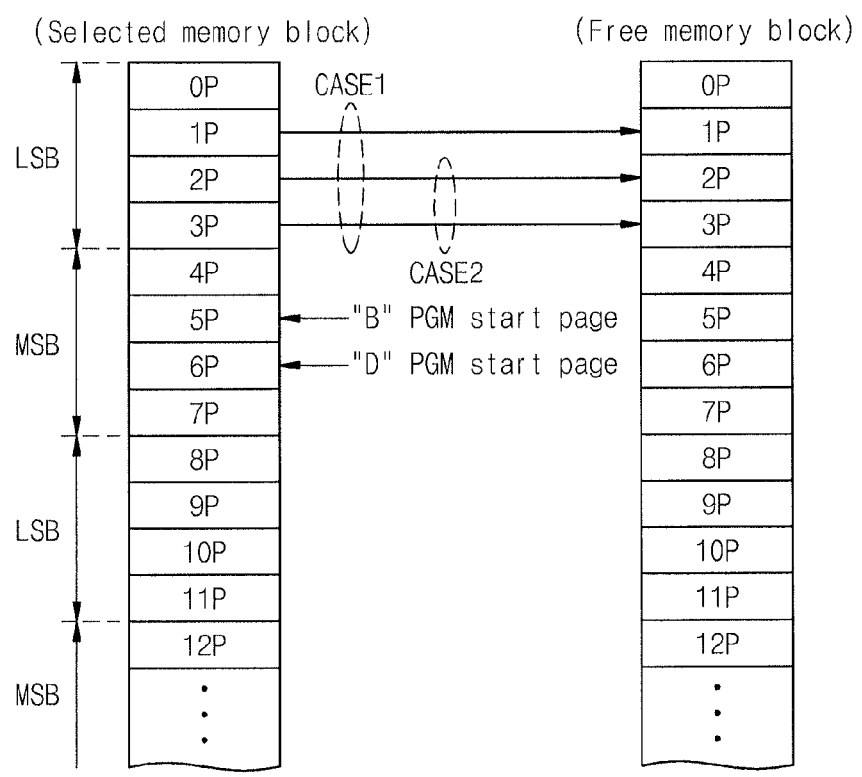
Figure 9:
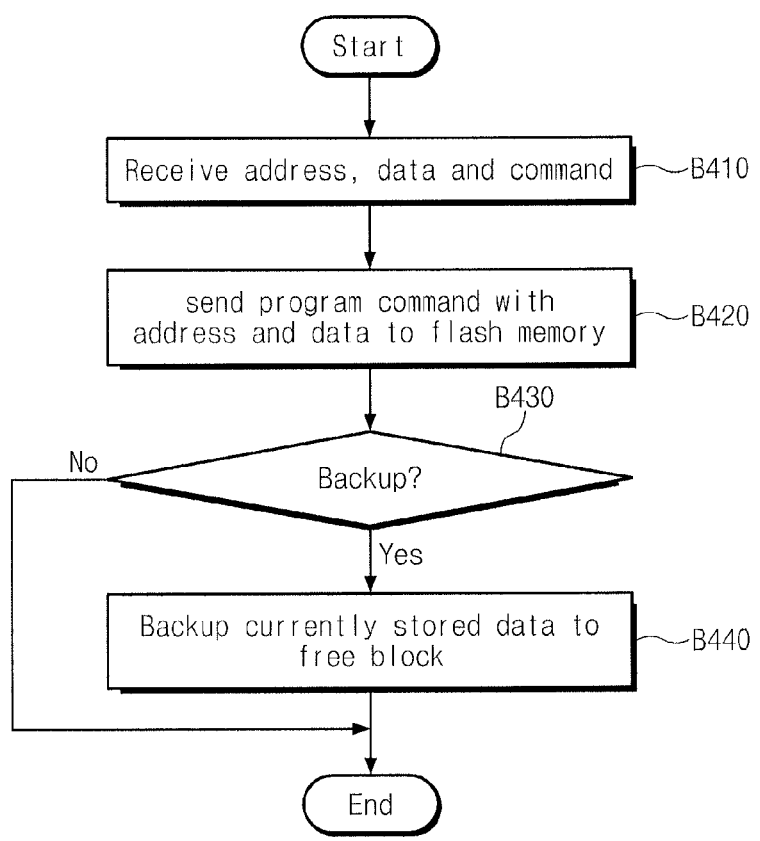
FIG. 9 is a diagram for describing an embodiment of a data backup operation at a program operation of a memory system according to aspects of the present invention.

FIG. 6 is a flowchart for describing an embodiment of a program operation of a memory system according to aspects of the present invention, FIGS. 7 and 8 are diagrams for describing embodiments of a program operation of a memory system according to aspects of the present invention, and FIG. 9 is a diagram for describing an embodiment of a data backup operation at a program operation of a memory system according to aspects the present invention. Hereinafter, a program operation of a memory system according to aspects of the present invention will be more fully described with reference to accompanying drawings. In these embodiments, it is assumed that a distance between an LSB page and an MSB page stored in the same memory cell, that is, a page offset value is '4'. A program operation of a memory system according to the present invention will be described under this assumption.

Referring to FIG. 6, when a program operation is required, a command, an address and data can be provided to a memory controller 200 from an external device (e.g., host) (B310). At this time, input data can be stored in a buffer memory 230. For convenience of description, as illustrated in FIG. 7, it is assumed that data 0P to 4P marked by 'A' is stored in a selected memory block of a flash memory device 100. The memory controller 200 can determine whether data was previously stored in a memory cell in which the input data is to be stored. Additionally, the memory controller 200 according to aspects of the present invention can determine whether data to be stored in a page corresponding to the required program operation is an LSB data bit of 2-bit data (B320). If data to be stored is an LSB data bit, the memory controller 200 can send a program command together with an address and data to the flash memory device 100 (B340). The flash memory device 100 can perform a program operation in response to the program command sent with the address and data.

On the other hand, if data to be stored is not an LSB data bit, there can be carried out a data backup operation with respect to LSB pages that belong to a page offset value on the basis of a start page of data to be currently stored. For example, in CASE1 of FIGS. 7 and 8, LSB page data 1P to 3P belonging to a page offset value (OFFSET=4) can be backed up to corresponding pages 1P to 3P of a free memory block on the basis of a start page 5P of data marked by 'B'. This is to prevent previously stored LSB data from being lost due to power failure at a program operation of data marked by 'B', that is, MSB data. A data backup operation can be made in various manners. For example, data can be backed up to a free memory block of the flash memory device 100 via a well-known copy-back program operation. Alternatively, data to be backed up can be stored in a corresponding page of a free memory block via the memory controller 200. This can necessitate a set of read and program operations. It will be apparent to one skilled in the art that an error detecting and correcting operation with respect to backup data read out via a read operation can be made via an error detecting and correcting unit (not shown) of the memory controller 200. It will also be apparent to one skilled in the art that the data backup operation is not limited to that described in this disclosure. In CASE2 of FIGS. 7 and 8, LSB page data 2P and 3P belonging to a page offset value (OFFSET=4) can be backed up to corresponding pages 2P and 3P of a free memory block on the basis of a start page 6P of data marked by 'D'. On the other hand, in CASE3 in FIGS. 7 and 8, since data F to be stored is a LSB data bit, the memory controller 200 can send a program command together with an address and data to the flash memory device 100 without a data backup operation (B340). The flash memory device 100 can perform a program operation in response to the program command sent with the address and data.

As understood from the above description, it is possible to prevent lower/LSB data bits from being lost due to power failure caused at a program operation of upper/MSB data bits.

A data backup operation, as described above, can be performed prior to a program operation. On the other hand, a data backup operation can be made successively after page data is programmed. For example, referring to FIG. 9, page data can be programmed to the flash memory device 100 via steps B410 and B420. And then, the memory controller 200 can determine whether LSB data is comprised within stored data by use of a page offset value (B430). If so, LSB data of the stored data can be backed up to a free memory block according to the above-described manner (B440). Afterwards, a program operation can be terminated.

Figure 10:
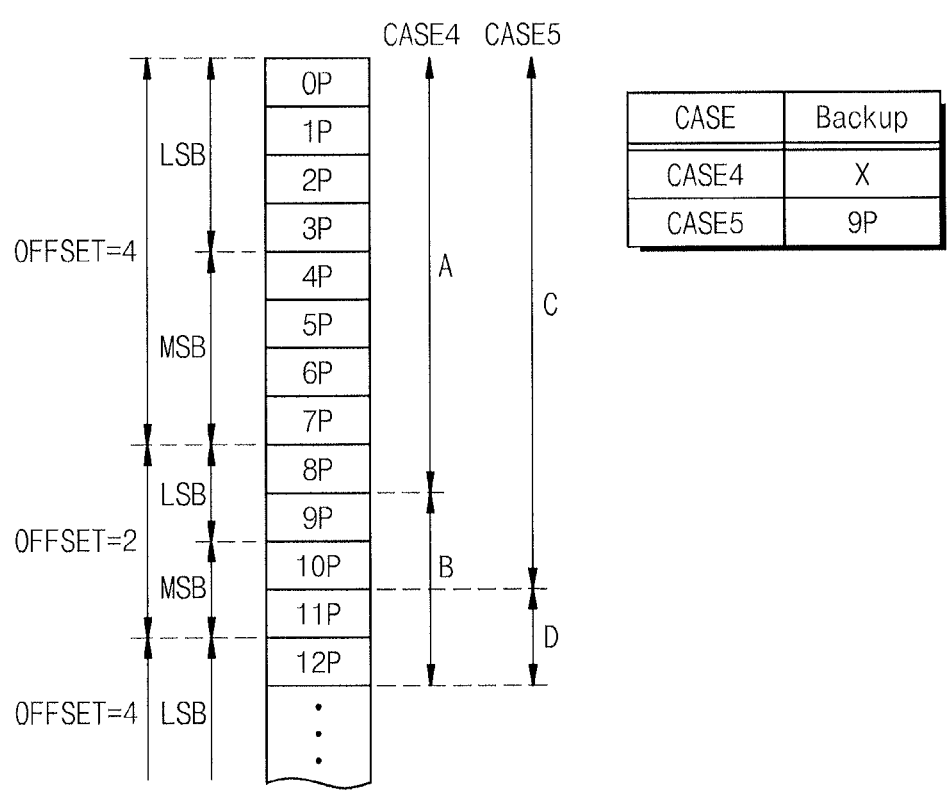
FIG. 10 is a diagram for describing an embodiment of a data backup operation at a program operation of a memory system according to an aspect of the present invention in a case where page offset values are different from each other.

As illustrated in FIG. 10, which is a diagram for describing an embodiment of a data backup operation for a program operation of a memory system according to aspects of the present invention in a case where page offset values are different from each other, a plurality of, for example, two page offset values can be applied to a memory block. A data backup operation of this case can also be performed using the above-described approach. For example, in CASE4, since data to be stored is LSB data, no data backup operation is carried out. However, in CASE5, since data to be stored is not LSB data, there is carried out a data backup operation with respect to LSB pages that belong to a page offset value, which is performed on the basis of a start page of the data to be stored. That is, LSB page data 9P, which belongs to a page offset value (OFFSET=2) on the basis of a start page 11P of data marked by 'D', can be backed up to a corresponding page 9P of a free memory block.

Figure 11:
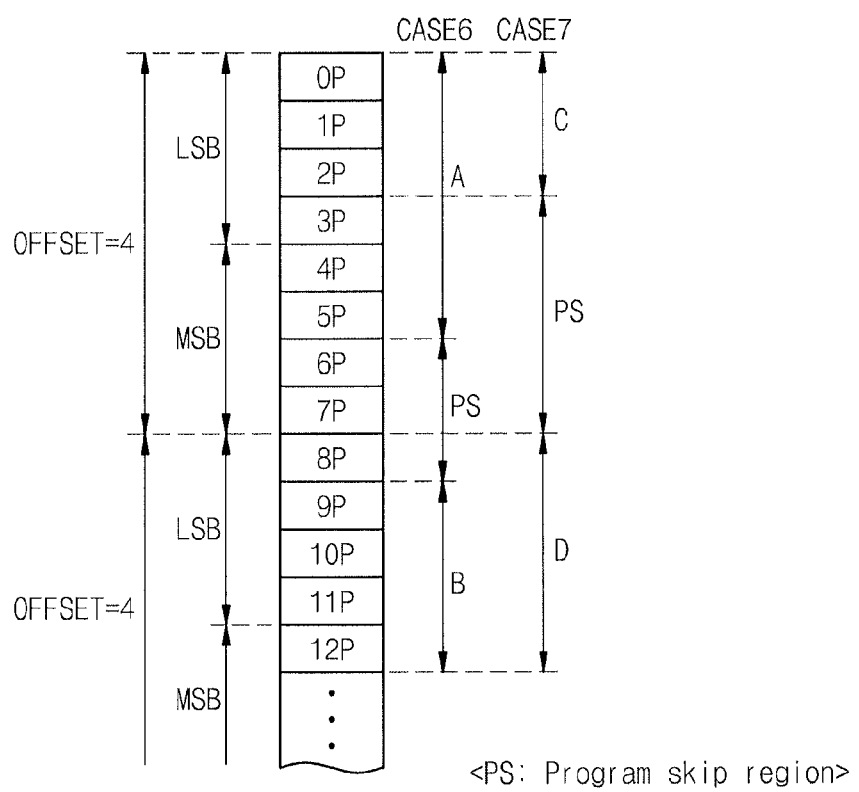
FIG. 11 is a diagram for describing an embodiment of a program operation of a memory system according to other aspects of the present invention.

FIG. 11 is a diagram for describing an embodiment of a program operation of a memory system according to other aspects of the present invention.

In order to prevent lower page data from being lost due to a power failure caused when programming upper page data, as illustrated in CASE6 of FIG. 11, it is possible to determine a page number (e.g., 10P), which is obtained by adding a page offset value (e.g., 6P) and a page number (e.g., 6P) where data marked by 'B' is to be stored, as a start page number of data marked by 'B'. Alternatively, in CASE7 of FIG. 11, it is possible to prevent lower data from being lost by setting pages affecting lower pages to free/empty pages. A free page can be detected via an increase of a page address. The CASE6 and CASE7 are available when storing large-volume data (e.g., moving pictures, MP3 files, pictures, and the like) and when small-volume data (e.g., meta data). Further, applying CASE7 to a memory system, which does not use a free memory block, can be available.

Figure 12:
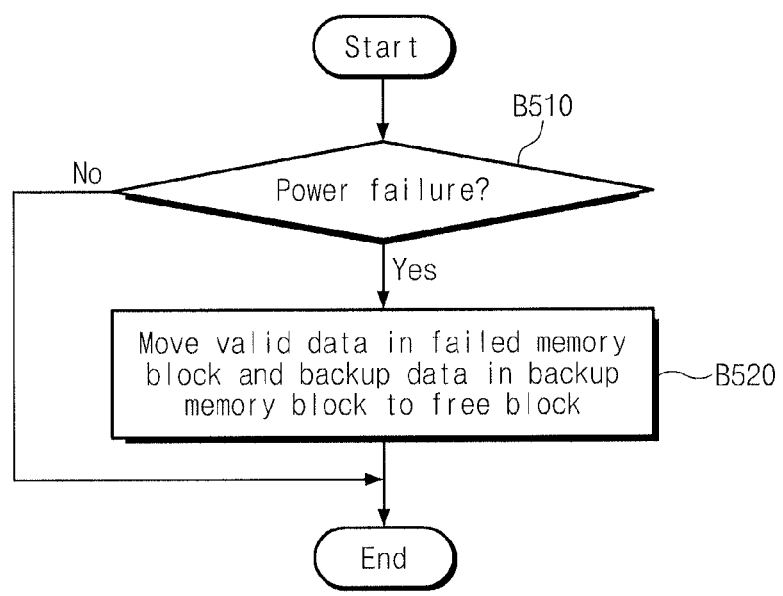
FIG. 12 is a flowchart for describing an embodiment of an operation of recovering lower data lost due to power failure caused at a program operation of upper data.
Figure 13:
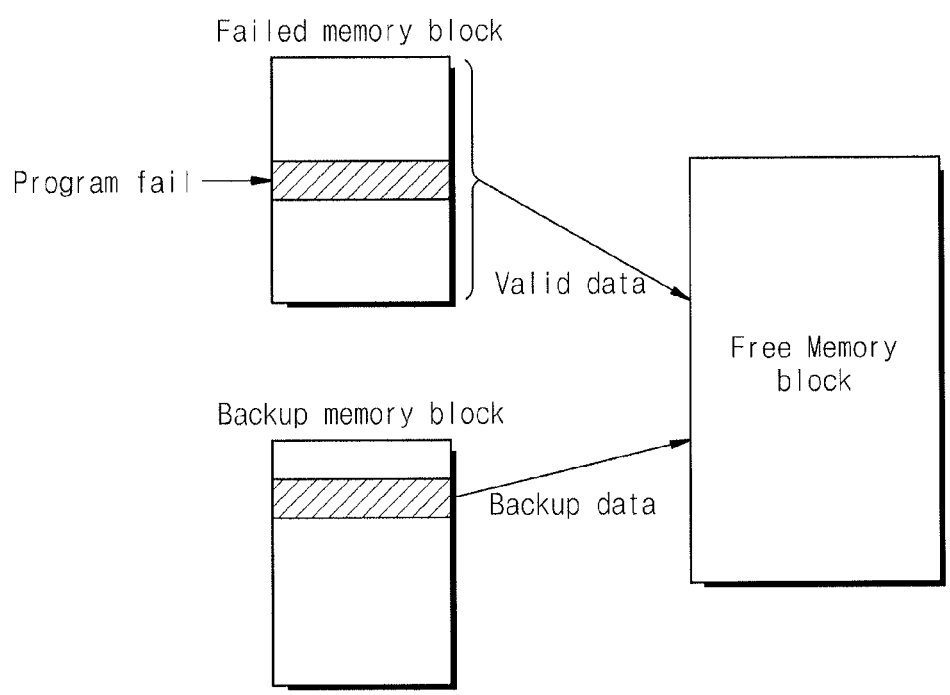
FIG. 13 is a diagram showing data flow according to an embodiment of a data recover operation.

FIG. 12 is a flowchart for describing an embodiment of an operation of recovering lower data lost due to power failure caused at a program operation of upper data, and FIG. 13 is a diagram showing data flow according to an embodiment of a data recovery operation.

Referring to FIG. 12, if power is turned on, a memory controller 200 can determine whether power failure arises, based on a power failure recovery function (B150). If power failure is determined not to be made, a data recovery operation can be terminated. Afterwards, the memory controller 200 can control a flash memory device 100 according to a request of an external device (e.g., host). If power failure is determined to be made, as illustrated in FIG. 13, the memory controller 200 can control the flash memory device 100 so as to copy to a free memory block both valid data in a power-failed memory block (that is, a failed memory block) and backup data in a backup memory block (B520). An operation of copying data to a free memory block can be made via various manners, such as a copy-back program manner, an iterative read and program manner, and the like. It is possible to recover lower data lost due to power failure via this data backup operation. A failed memory block and a backup memory block can be assigned to a free memory block via an erase procedure (or, without an erase procedure).

Figure 14:
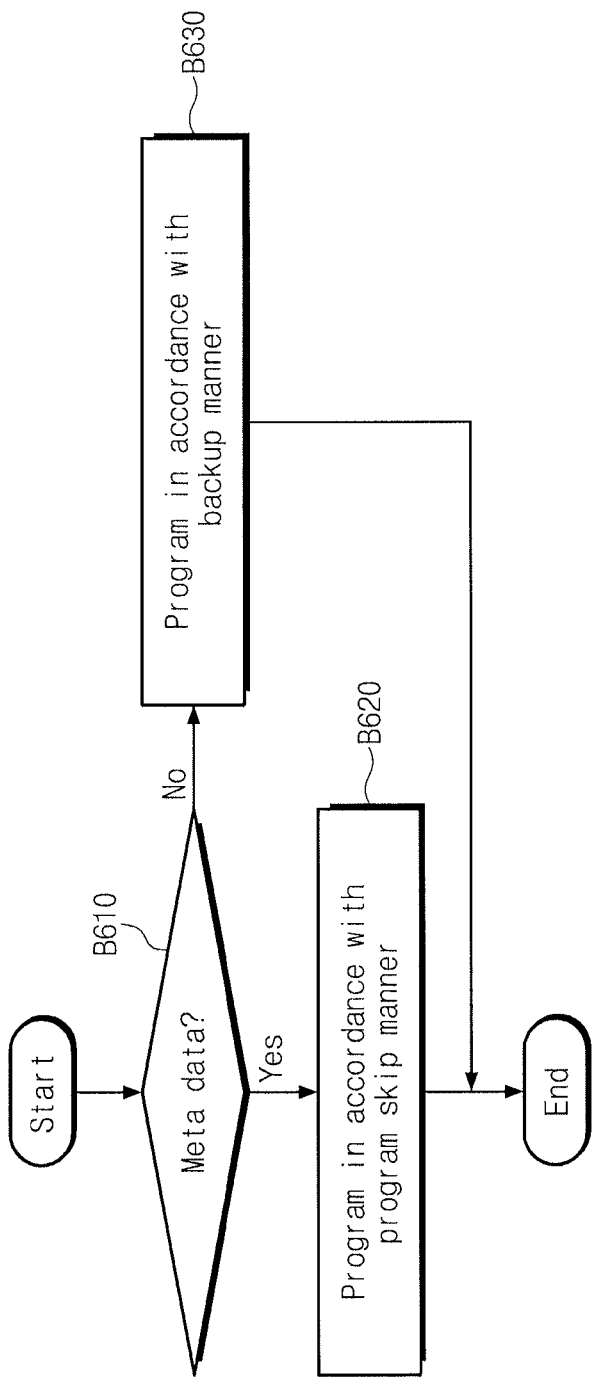
FIG. 14 is a flowchart for describing embodiments of operations for preventing loss of lower data based on a program data type at a program operation in a memory system in accordance with aspects of the present invention.

FIG. 14 is a flowchart for describing embodiments of operations for preventing losing lower data are performed in different manners based on a program data type at a program operation according to a memory system of the present invention.

Referring to FIG. 14, a memory controller 200 can determine whether data to be stored in a flash memory device 100 is meta data (B610). In a case where data to be stored in a flash memory device 100 is meta data, the memory controller 200 can perform a program operation according to a program skip manner that is described in FIG. 11 (B620). With this program manner, it is possible to prevent losing lower data due to power failure that is generated at a program operation of upper data. On the other hand, in a case where data to be stored in the flash memory device 100 is not meta data, the memory controller 200 can perform a program operation based on a backup manner that is described with reference to FIGS. 6 and 9 (B630). Likewise, by this program manner, it is possible to prevent losing lower data due to power failure that is generated at a program operation of upper data.

Figure 15:
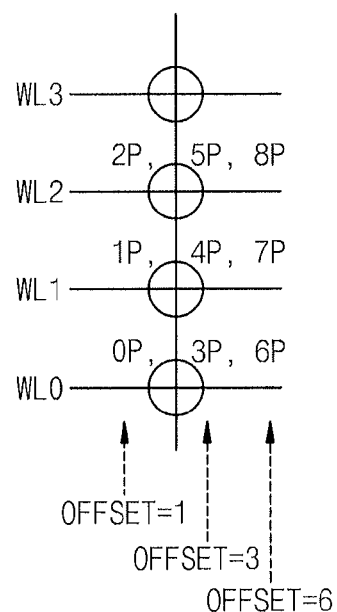
FIG. 15 is a diagram for describing an embodiment of a data backup operation of a flash memory device storing 3-bit data per cell.

FIG. 15 is a diagram for describing an embodiment of a data backup operation of a flash memory device storing 3-bit data per cell.

In the case that 3-bit data is stored per cell, page offset values can be different when storing a second data bit and when storing a third data bit. As understood from FIG. 15, a lower data bit, that is, an LSB data bit 0P/1P/2P can be lost due to power failure that is made when a second data bit 3P/4P/5P is stored as an upper data bit. In this case, a page offset value can be '3'. Further, an LSB data bit 3P/4P/5P can be lost due to power failure that is made when a third data bit 6P/7P/8P is stored as an upper data bit. In this case, a page offset value can be '6'. Accordingly, there can be performed a data backup operation according to different page offset values when storing M-bit data (e.g., where M is 3 or more integer). A data backup operation is carried out in the same manner as described above, and description thereof is thus omitted.

Figure 16:
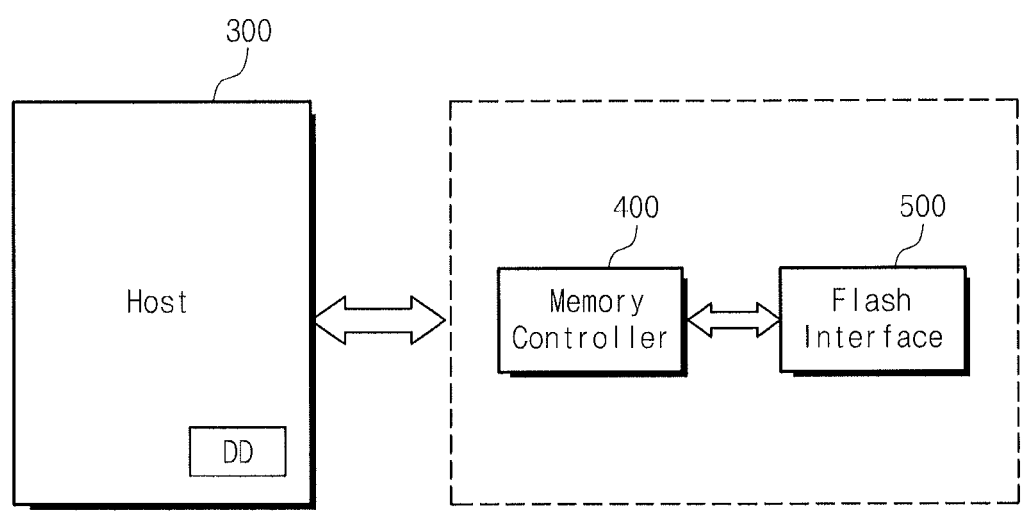
FIG. 16 is a block diagram showing an embodiment of a computing system according to another aspect of the present invention.

FIG. 16 is a block diagram showing an embodiment of a computing system according to another aspect of the present invention.

Referring to FIG. 16, a computing system can include a host 300, a memory controller 400, and a flash memory device 500. The memory controller 400 can be configured to control the flash memory device 500 according to a request of the host 300. Unlike a memory controller described in FIG. 2, the memory controller 400 in FIG. 16 can be configured to perform conventional memory control, functions. The host 300 can include a device driver DD, which is used not only to perform an interface function with the memory controller 400, but also to perform functions for preventing losing lower data according to the above-described data backup manner. This data backup manner is identical to that described above, and description thereof is thus omitted.

Figure 17:
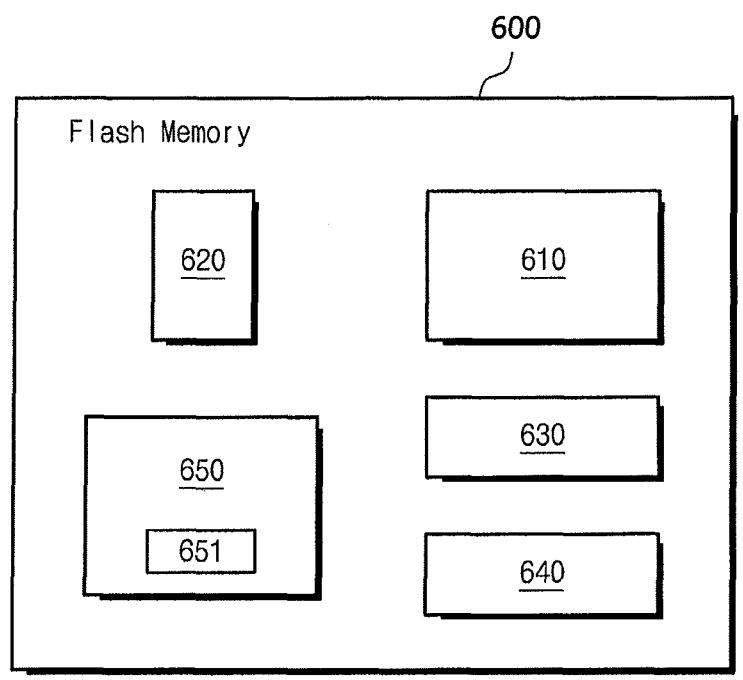
FIG. 17 is a block diagram showing an embodiment of a flash memory device according to still another aspect of the present invention.

FIG. 17 is a block diagram showing an embodiment of a flash memory device according to still another aspect of the present invention.

Referring to FIG. 17, a flash memory device 600 can include a memory cell array 610, a row selector circuit 620, a sense amplifier and write driver circuit 630, a column selector circuit 640, and control logic 650. In exemplary embodiments, the flash memory device 600 can be a NAND flash memory device. In particular, the control logic 650 can include a firmware 651 that is necessitated to perform the above-described data backup operation. The control logic 650 can control the above-described data backup operation via the firmware 651.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a multi-bit flash memory device which includes memory cells, each memory cell configured to store multi-bit data, each data of the multi-bit data being included in at least one of a lower page and an upper page, the method comprising:
    storing a first data into a lower page;
    setting at least one page affecting the lower page to be a free; and
    then storing a second data into a next page to the at least one page,
    wherein the next page is a lower page not affecting the lower page in which the first data is stored during storing the second data, and wherein the first data stored in the lower page is not copied to any memory cell before completion of storing the second data in the next page.

2. The method of claim 1, wherein the first data and the second data is a type of meta data.

3. The method of claim 1, wherein when each memory cell is configured to store an LSB data and an MSB data, the lower page corresponds to a page to store the LSB data.

4. The method of claim 1, wherein the next page does not store any data.

5. The method of claim 1, wherein the lower page storing the first data and the lower page storing the second data are included in different memory cells.

6. The method of claim 5, wherein word lines of the each of the different memory cells are next to each other.

* * * * *